United States Patent
Kuo et al.

(10) Patent No.: US 10,686,433 B1
(45) Date of Patent: Jun. 16, 2020

(54) CIRCUIT OPERATING SPEED DETECTING CIRCUIT

(71) Applicant: REALTEK SEMICONDUCTOR CORPORATION, Hsinchu (TW)

(72) Inventors: Chun-yi Kuo, Hsinchu County (TW); Wen-Hsuan Hsu, Changhua County (TW); Ying-Yen Chen, Chiayi County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/573,136

(22) Filed: Sep. 17, 2019

(30) Foreign Application Priority Data

Dec. 28, 2018 (TW) .............................. 107147726 A

(51) Int. Cl.
*H03K 5/135* (2006.01)
*H03K 5/00* (2006.01)

(52) U.S. Cl.
CPC ... *H03K 5/135* (2013.01); *H03K 2005/00019* (2013.01)

(58) Field of Classification Search
CPC ...................................................... H03K 5/135
USPC ........................................................ 327/276
See application file for complete search history.

(56) References Cited

U.S. PATENT DOCUMENTS

| 4,233,525 A * | 11/1980 | Takahashi | G01R 29/0273 |
| | | | 327/31 |
| 8,248,136 B1 * | 8/2012 | Zhang | H03K 5/131 |
| | | | 327/262 |
| 9,772,670 B2 | 9/2017 | Yu et al. | |
| 2004/0257723 A1* | 12/2004 | Naffziger | G06F 1/3203 |
| | | | 361/18 |
| 2014/0237302 A1 | 8/2014 | Berry, Jr. et al. | |
| 2014/0244947 A1 | 8/2014 | Song | |
| 2017/0060221 A1* | 3/2017 | Yu | G06F 1/3296 |
| 2017/0301381 A1* | 10/2017 | Seomun | G11C 7/1012 |

FOREIGN PATENT DOCUMENTS

| TW | 201434050 | 9/2014 |
| TW | 201710832 | 3/2017 |

OTHER PUBLICATIONS

OA letter of counterpart TW application of application No. 107147726 dated Aug. 15, 2019. Summary of the OA letter: Claims 1-9 are rejected as being unpatentable over the cited reference 1 (TW 201434050(A), also published as U.S. 2014244947(A1)) and reference 2 (TW 201710832(A), also published as U.S. Pat. No. 9,772,670(B2)).
OA letter of (U.S. Appl. No. 16/586,157) dated Mar. 17, 2020.

\* cited by examiner

*Primary Examiner* — Tomi Skibinski
(74) *Attorney, Agent, or Firm* — WPAT, PC

(57) ABSTRACT

Disclosed is a circuit operating speed detecting circuit configured to detect an operating speed of a target circuit during a monitor mode. The circuit operating speed detecting circuit includes a signal generator, an adjustable delay circuit, and a signal detector. During the monitor mode, the signal generator generates a predetermined signal in a current operating condition, the adjustable delay circuit generates a delay signal according to the predetermined signal in the current operating condition, and the signal detector detects the degree of delay of the delay signal in the current operating condition so as to generate a first result if the degree of delay is not greater than a predetermined threshold and generate a second result if the degree of delay is greater than the predetermined threshold, in which the first and the second results are related to the operating speed of the target circuit.

20 Claims, 8 Drawing Sheets

S810 — in a first operating condition, outputting a calibration signal to the adjustable delay circuit to adjust the adjustable delay circuit and have the delay contribution of the adjustable delay circuit be equal to a predetermined delay, in which when the delay contribution is equal to the predetermined delay, the value of the calibration signal is a first value

Fig. 8

CIRCUIT OPERATING SPEED DETECTING CIRCUIT

BACKGROUND OF THE INVENTION

1. Field of the Invention

The present invention relates to a detecting circuit, especially to a circuit operating speed detecting circuit.

2. Description of Related Art

The operating speed of an integrated circuit (IC) is dependent on the length of a critical path of the IC; in other words, it is dependent on the degree of signal transmission delay caused by the critical path. The critical path is subject to the manufacturing process, voltage, temperature, aging status, and the like of the IC, in which the manufacturing process of the IC is known and invariable, the voltage is affected by the environmental condition (e.g., an unstable external power source) and the usage/condition of the IC (e.g., the IC or a device including the IC executing a specific application program; or the IR drop of the IC) and thereby varies with time, the temperature is affected by the environmental condition (e.g., the weather) and the usage/condition of the IC (e.g., the IC or a device including the IC executing a specific application program; or the IC power) and thereby varies with time, and the aging status is dependent upon the remaining life of the IC.

In light of the above, the operating speed of the IC varies with time due to the composite influence of the manufacturing process, voltage, temperature, and aging status (PVTA). The optimum performance of the IC may be achieved if the variation of the operating speed of the IC is well monitored and used for adjusting the IC. Since the operating speed of the IC is related to the upper limit of the operating clock allowing the IC to operate normally, the higher the operating speed, the higher the upper limit.

Several techniques capable of measuring the operating speed of an IC are listed below:
(1) Ring oscillator. This technique can estimate the operating speed of an IC by monitoring the operating speed of a ring oscillator, but the problems are: slow response; and impossible to measure the voltage variation within a short period of time.
(2) Voltage meter/temperature meter. This technique measures the voltage/temperature of the internal part of an IC to estimate the operating speed of the IC, but the problems are: consuming a lot of circuit area; requiring conversion of the result of measurement to obtain the operating speed of the IC; and slow response.
(3) Critical path monitoring. This technique measures the signal delay caused by the critical path of an IC to estimate the operating speed of the IC, but the problems are: complicated design flow because the critical path is usually uncertain till the late stage of the design of the IC; hard to find out the dominant critical path because different critical paths of the IC are dominant in different environmental conditions respectively; and impossible to monitor all of the critical paths.
(4) Pre-error detecting. This technique connects the critical path of an IC with an additional delay circuit in parallel and detects the output of the delay circuit; when the output of the delay circuit indicates that the signal delay gets longer and longer, it shows that the operating speed of the IC trends down and the IC may operate abnormally with the current operating clock in no time. This technique has the following problems: consuming a lot of circuit area; and the delay caused by the critical path becoming longer due to the extra loading of the additional delay circuit.

SUMMARY OF THE INVENTION

An object of the present invention is to provide a circuit operating speed detecting circuit capable of preventing the problems of the prior arts.

The circuit operating speed detecting circuit of the present invention is configured to detect an operating speed of a target circuit during a monitor mode while the target circuit is configured to operate according to a reference clock. An embodiment of the circuit operating speed detecting circuit includes a signal generator, an adjustable delay circuit, and a signal detector. The signal generator is configured to generate a predetermined signal in a current operating condition during the monitor mode, in which the current operating condition relates to at least one of a manufacturing process of the target circuit, a current operating voltage of the target circuit, a current temperature of the target circuit, and a current aging status of the target circuit and thus the current operating condition varies with time. The adjustable delay circuit is coupled between the signal generator and the signal detector, and configured to generate a delay signal according to the predetermined signal in the current operating condition during the monitor mode. The signal detector is configured to detect the degree of delay of the delay signal in the current operating condition during the monitor mode, and thereby generate a first result in response to the degree of delay being equal to or less than a predetermined threshold and generate a second result in response to the degree of delay being greater than the predetermined threshold, wherein each of the first and second results is related to the operating speed of the target circuit; for instance, the first result indicates that the target circuit can operate normally in the current operating condition and the second result indicates that the target circuit may not operate normally in the current operating condition, and thus the maximum operating speed of the target circuit in connection with the first result is higher than the maximum operating speed of the target circuit in connection with the second result. In an exemplary implementation, when the target circuit operates in the current operating condition, if the signal detector generates the first result, it indicates that the frequency of the reference clock should be maintained or increased for better performance, and if the signal detector generates the second result, it indicates that the frequency of the reference clock should be decreased for safe operation.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 8 shows the step executed by the calibrating circuit of FIG. 7.

DETAILED DESCRIPTION OF THE PREFERRED EMBODIMENTS

Figure 1:
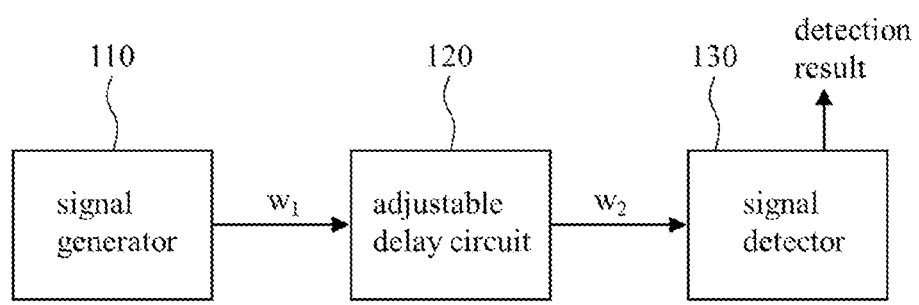
FIG. 1 shows an embodiment of the circuit operating speed detecting circuit of the present invention.

FIG. 1 shows an embodiment of the circuit operating speed detecting circuit of the present invention. The circuit operating speed detecting circuit 100 of FIG. 1 is configured to detect the operating speed of a target circuit (not shown) by detecting the effective delay of an adjustable delay circuit during a monitor mode while the target circuit is configured to operate according to a reference clock. In this embodiment, both the circuit operating speed detecting circuit 100 and the target circuit are included in the same integrated circuit, and the circuit operating speed detecting circuit 100 is a digital circuit, but not limited thereto. The circuit operating speed detecting circuit 100 includes a signal generator 110, an adjustable delay circuit 120, and a signal detector 130; the details of these circuits are described in the later paragraphs.

Please refer to FIG. 1. During the monitor mode, the signal generator 110 generates a predetermined signal $w_1$ (e.g., a signal including a rising edge, or a pulse signal) in a current operating condition which relates to at least one of the following factors: the manufacturing process of the target circuit; the current operating voltage of the target circuit; the current temperature of the target circuit; and the current aging status of the target circuit. Since the voltage, temperature, and aging status vary with time, the current operating condition varies with time.

Please refer to FIG. 1. The adjustable delay circuit 120 is coupled between the signal generator 110 and the signal detector 130. During the monitor mode, the adjustable delay circuit 120 generates a delay signal $w_2$ according to the predetermined signal $w_1$ in the current operating condition. It should be noted that the delay caused by the adjustable delay circuit 120 in a default operating condition (e.g., the worst/worse operating condition (such as the lowest/lower voltage condition) allowing the target circuit to operate normally) could be preset, given by a user, or determined during a calibration mode that is described in the later paragraph; in addition, both the transmission delay characteristic of the adjustable delay circuit 120 and the transmission delay characteristic of the target circuit vary with the current operating condition which varies with time. In an exemplary implementation, the adjustable delay circuit 120 has no need to connect with any critical path of the target circuit because the transmission delay of the critical path can be estimated by detecting the delay signal $w_2$ of the adjustable delay circuit 120, which implies that the circuit operating speed detecting circuit 100 has no need to find out and connect with any critical path of the target circuit for detection; consequently, the design of the circuit operating speed detecting circuit 100 is simplified and easy to be implemented. In order to ensure that the trend of the transmission delay characteristic of the adjustable delay circuit 120 is linearly/nonlinearly proportional to the trend of the transmission delay characteristic of the target circuit, the design of the adjustable delay circuit 120 can be realized in at least one of the following ways: having at least some basic component(s) (e.g., standard MOS transistor(s)) of the adjustable delay circuit 120 be identical/similar to at least some basic component(s) of the target circuit; designing the adjustable delay circuit 120 according to the simulation result of the transmission delay characteristic of at least one critical path of the target circuit; and designing the adjustable delay circuit 120 according to known transmission delay characteristics (e.g., transmission delay characteristics of critical paths) of a circuit (e.g., an old version of the target circuit) identical/similar to the target circuit.

Please refer to FIG. 1. During the monitor mode, the signal detector 130 detects the degree of delay of the delay signal $w_2$ in the current operating condition and thereby generates a detection result. More specifically, the signal detector 130 generates the detection result being a first result if the degree of delay is not greater than a predetermined threshold, and generates the detection result being a second result if the degree of delay is greater than the predetermined threshold, wherein each of the first and second results is related to the operating speed of the target circuit. In detail, the first result indicates that the target circuit can operate normally with an enough margin in the current operating condition and the second result indicates that the target circuit may not operate normally once the current operating condition is getting worse; accordingly, the maximum workable operating speed of the target circuit in connection with the first result is higher than the maximum workable operating speed of the target circuit in connection with the second result. Each of the first and second results can be used for adjusting the operation of the target circuit; for instance, when the target circuit operates in the current operating condition, if the signal detector 130 generates the first result, this can be used as an indication of maintaining or increasing the frequency of the reference clock for better performance, and if the signal detector 130 generates the second result, this can be used as an indication of decreasing the frequency of the reference clock for safe operation. Besides, the predetermined threshold can be determined according to the cycle of the reference clock; for instance, the predetermined threshold is equal to the cycle of the reference clock.

Figure 2:
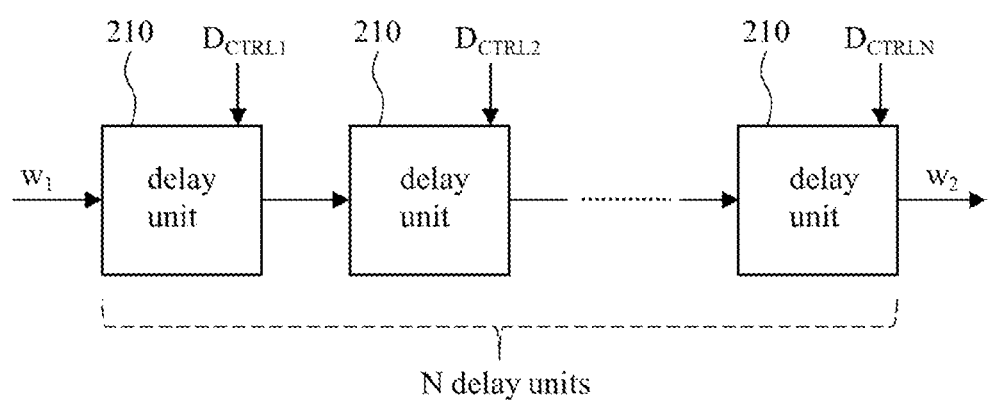
FIG. 2 shows an embodiment of the adjustable delay circuit of FIG. 1.

FIG. 2 shows an embodiment of the adjustable delay circuit 120 of FIG. 1. As shown in FIG. 2, the adjustable delay circuit 120 includes N delay units 210 that are connected in series; these delay units 210 can be identical or different according to the demand for implementation. The adjustable delay circuit 120 enables M delay unit(s) 210 among the N delay units 210 according to N control signals ($D_{CTRL1}$~$D_{CTRLN}$) so as to delay the predetermined signal $w_1$ and thereby generate the delay signal $w_2$, in which the N is an integer greater than one and the M is a positive integer not greater than the N. In brief, the adjustable delay circuit 120 enables some or all of the N delay units 210 according to the N control signals ($D_{CTRL1}$~$D_{CTRLN}$) to generate the delay signal $w_2$. In an exemplary implementation, a first delay unit and a second delay unit of the N delay units 210 are different so that the maximum delay caused by the first delay unit is different from the maximum delay caused by the second delay unit in the same condition; for instance, the number of standard delay components included in the first delay unit is different from the number of the standard delay components included in the second delay unit, and thus the maximum delays respectively caused by the first and second delay units are different. In another exemplary implementation, the N delay units 210 are divided into a first delay unit group (including X delay unit(s), in which the X is a positive integer) and a second delay unit group (including Y delay unit(s), in which the Y is a positive integer); the first delay unit group is used for adjusting the predetermined signal $w_1$ roughly and thereby outputting a first delay signal to the second delay unit group, and the second delay unit group is used for adjusting the first delay signal finely and thereby outputting the delay signal $w_2$; the maximum delays respectively caused by any two delay units among the first/second delay unit group can be the same or different. In yet another exemplary implementation, the aforementioned second delay unit group is composed of a plurality of delay unit sets connected in parallel; each of the delay unit sets is designed to realize a transmission delay characteristic, and one of the delay unit sets is used for generating the delay signal $w_2$.

Figure 3:
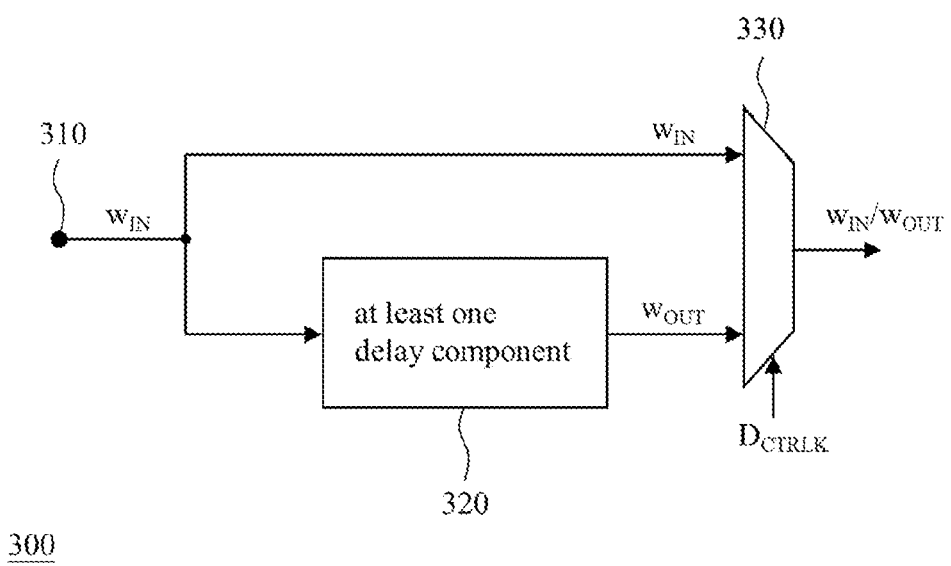
FIG. 3 shows an embodiment of each delay unit of FIG. 2.

FIG. 3 shows a delay unit 300 which is an embodiment of each delay unit 210 of FIG. 2. The delay unit 300 includes an input terminal 310, at least one delay component 320, and a multiplexer 330. The input terminal 310 is configured to receive an input signal $w_{IN}$ that is the predetermined signal $w_1$ or the delay version thereof. The at least one delay component 320 is configured to generate an output signal $w_{OUT}$ by delaying the input signal $w_{IN}$. When the at least one delay component 320 includes a plurality of delay components (e.g., known or self-developed delay components), these delay components can optionally be connected in series according to the demand for implementation. The multiplexer 330 is coupled to the input terminal 310 and the at least one delay component 320, and configured to output one of the input signal $w_{IN}$ and the delayed output signal $w_{OUT}$ according to a control signal ($D_{CTRLK}$) of the aforementioned N control signals. In light of the above, by controlling the multiplexer 330 with the control signal $D_{CTRLK}$, each of the N delay units 210 can contribute delay or no delay, and thus the delay between the predetermined signal $w_1$ and the delay signal $w_2$ as shown in FIG. 2. can be set in the default operating condition (e.g., the worst/worse operating condition allowing the target circuit to operate normally).

Figure 4:
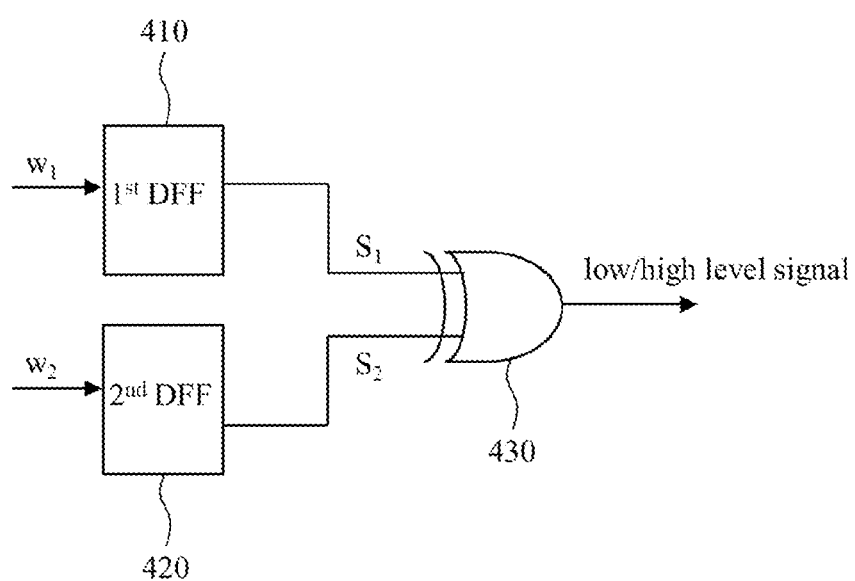
FIG. 4 shows an embodiment of the signal detector of FIG. 1.

FIG. 4 shows an embodiment of the signal detector 130 of FIG. 1. This embodiment is suitable for detecting the delay signal $w_2$ generated by the adjustable delay circuit 120 of FIG. 2. As shown in FIG. 4, the signal detector 130 includes a first D-type flip flop ($1^{st}$ DFF) 410, a second D-type flip flop ($2^{nd}$ DFF) 420, and an Exclusive-Or gate (XOR gate). The first DFF 410 and the second DFF 420 are configured to sample the predetermined signal $w_1$ and the delay signal $w_2$ at the same time respectively and thereby output two sample results $S_1$, $S_2$. The XOR gate 430 is configured to determine whether the degree of delay of the delay signal $w_2$ is greater than the predetermined threshold according to the relation between the two sample results $S_1$, $S_2$; more specifically, when the two sample results $S_1$, $S_2$ are the same, the XOR gate 430 outputs a low level signal indicating that the degree of delay of the delay signal $w_2$ is not greater than the predetermined threshold, and when the two sample results $S_1$, $S_2$ are different, the XOR gate 430 outputs a high level signal indicating that the degree of delay of the delay signal $w_2$ is greater than the predetermined threshold.

Figure 5:
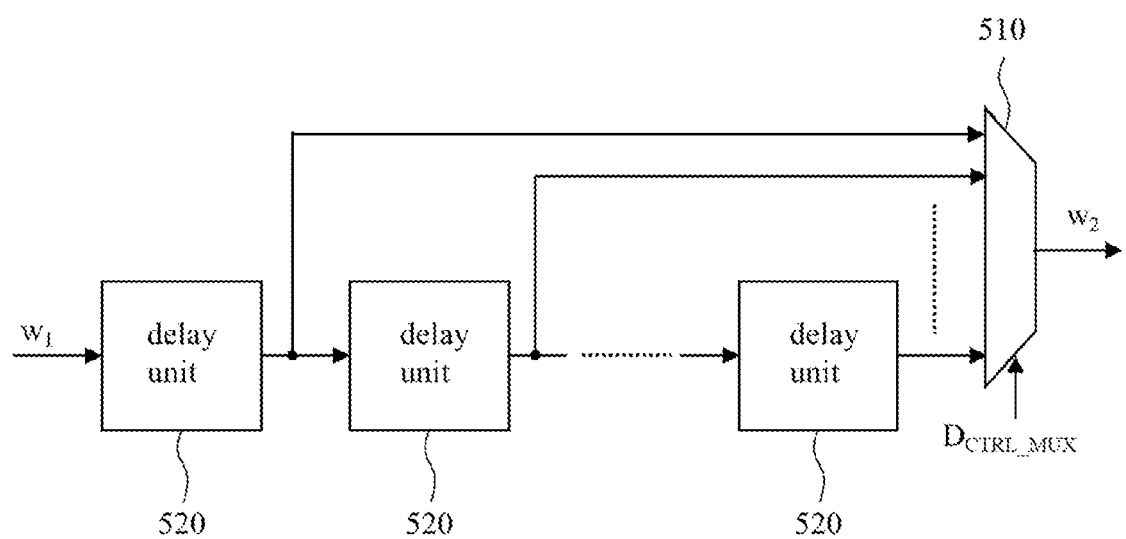
FIG. 5 shows another embodiment of the adjustable delay circuit of FIG. 1.

FIG. 5 shows another embodiment of the adjustable delay circuit 120 of FIG. 1. The major difference between the embodiment of FIG. 5 and the embodiment of FIG. 2 is that the embodiment of FIG. 5 includes a multiplexer 510 and the delay units 520 of FIG. 5 could be different from the delay units 210 of FIG. 2. The multiplexer 510 is configured to receive the output signal of each of the N delay units 520 and then output one of the N output signals as the delay signal $w_2$ according to a control signal $D_{CTRL\_MUX}$. It should be noted that the feature of the embodiment of FIG. 2 can be applied to the embodiment of FIG. 5 as long as such application is reasonable and practicable.

Figure 6:
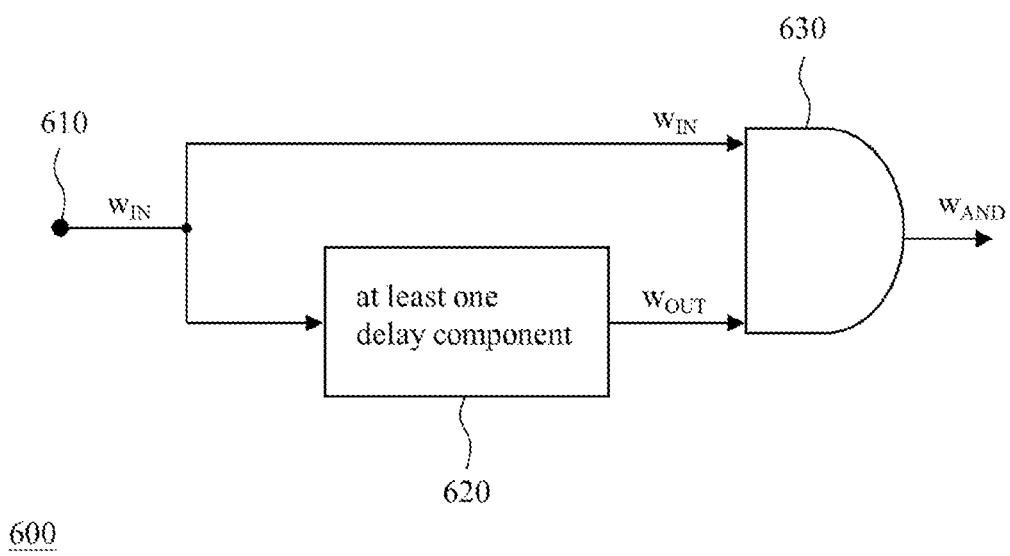
FIG. 6 shows an embodiment of each delay unit of FIG. 5.

FIG. 6 shows a delay unit 600 which is an embodiment of each delay unit 520 of FIG. 5. The delay unit 600 includes an input terminal 610, at least one delay component 620, and an AND gate 630. The input terminal 610 is configured to receive an input signal $w_{IN}$ that is the predetermined signal $w_1$ or the delay version thereof. Compared with the predetermined signal $w_1$, the delay version of $w_1$ could be distorted; for instance, the predetermined signal $w_1$ is a pulse signal having a pulse width wider than the pulse width of the delay version of $w_1$. The at least one delay component 620 is configured to generate an output signal $w_{OUT}$ by delaying the input signal $w_{IN}$. When the at least one delay component 620 includes a plurality of delay components, these delay components can optionally be connected in series according to the demand for implementation. The AND gate 630 is configured to output a logical conjunction result $w_{AND}$ of the input signal $w_{IN}$ and the delayed output signal $w_{OUT}$; for instance, providing the input signal $w_{IN}$ is a pulse signal, since the output signal $w_{OUT}$ is the delay version of the input signal $w_{IN}$, the logical conjunction result $w_{AND}$ is a narrower pulse signal or a low level signal in accordance with the duration of the input signal $w_{IN}$ and the output signal $w_{OUT}$ being at the high level concurrently. In light of the above, the control signal $D_{CTRL\_MUX}$ selects one of the N output signals $w_{OUT}$ as the delay signal $w_2$ so as to determine the delay between the predetermined signal $w_1$ and the delay signal $w_2$ in the default operating condition (e.g., the worst/worse operating condition allowing the target circuit to operate normally) It should be noted that when the predetermined signal $w_1$ is a pulse signal, the narrower the pulse width of the delay signal $w_2$, the greater the degree of delay of the delay signal $w_2$; if the pulse width of the delay signal $w_2$ is 0, this implies that the degree of delay of the delay signal $w_2$ reaches or exceeds the aforementioned predetermined threshold. It should also be noted that in order to measure the pulse width of the output signal of the multiplexer 510, the signal detector 130 of FIG. 1 can incorporate a known pulse width measuring circuit (e.g., a counter) to realize the measurement of pulse width.

Figure 7:
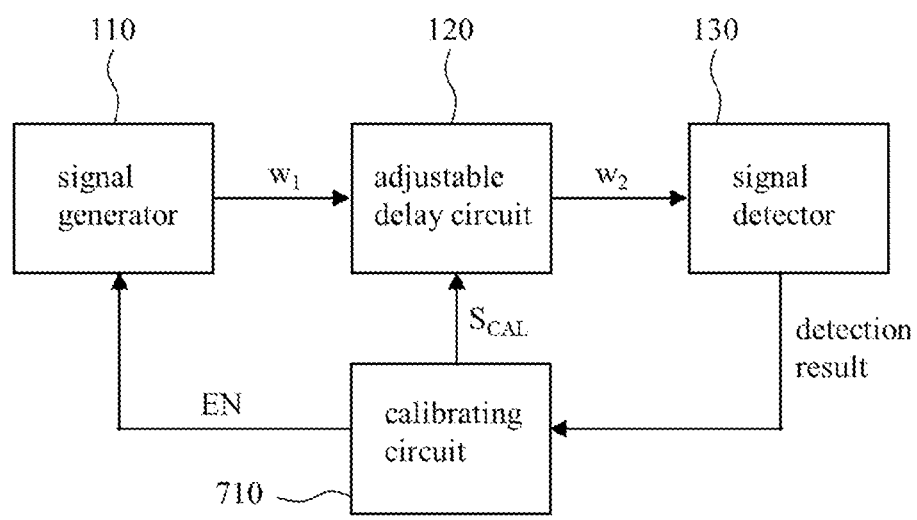
FIG. 7 shows another embodiment of the circuit operating speed detecting circuit of the present invention.

FIG. 7 shows another embodiment of the circuit operating speed detecting circuit of the present invention. This embodiment is practicable in the aforementioned monitor mode and capable of finding the relation between the operating condition of the target circuit and the delay contribution of the adjustable delay circuit 120 during a calibration mode, in which the relation allows a user or the circuit operating speed detecting circuit 700 of FIG. 7 to set the adjustable delay circuit 120 accordingly. Compared with FIG. 1, the circuit operating speed detecting circuit 700 of FIG. 7 further includes a calibrating circuit 710 that is configured to execute at least the following step (as shown in FIG. 8) during the calibration mode:

step S810: In a first operating condition such as the lowest voltage condition allowing the target circuit to operate normally, outputting a calibration signal $S_{CAL}$ to the adjustable delay circuit 120 to adjust the adjustable delay circuit 120 and have the delay contribution of the adjustable delay circuit 120 be equal to a predetermined delay (e.g., the cycle of the aforementioned reference clock), in which when the delay contribution is equal to the predetermined delay, the value of the calibration signal $S_{CAL}$ is a first value, and a first number of delay component(s) among the adjustable delay circuit 120, which could be composed of the aforementioned N delay units 210/520, is enabled to delay the predetermined signal $w_1$. An instance of the aforementioned lowest voltage condition is that the switching speed of the NMOS and PMOS transistors of the target circuit is typical, the operating voltage is 0.9V, the temperature is 25□, and the aging status has not reached a predetermined aging status.

It should be noted that during the monitor mode, the first operating condition is treated as a warning operating condition of the target circuit, and the adjustable delay circuit 120 is set in accordance with the first value of the calibration signal $S_{CAL}$ that is dependent upon the first operating condition. In addition, during the calibration mode, in a second operating condition such as a normal voltage condition (e.g., a condition that the switching speed of the NMOS and PMOS transistors of the target circuit is typical, the operating voltage is 1V, the temperature is 25° C., and the aging status has not reached a predetermined aging status) allowing the target circuit to operate normally, the calibration signal $S_{CAL}$ is outputted to the adjustable delay circuit 120 to adjust the adjustable delay circuit 120 and thereby have the delay contribution of the adjustable delay circuit 120 be equal to the predetermined delay (e.g., the cycle of the aforementioned reference clock), in which when the delay contribution is equal to the predetermined delay, the value of the calibration signal $S_{CAL}$ is a second value, and a second number of delay components of the adjustable delay circuit 120, which could be composed of the aforementioned N delay units 210/520, is enabled to delay the predetermined signal $w_1$. The second number of delay components is greater than the aforementioned first number of delay component(s) because a delay caused by an enabled delay component in the second operating condition is less than the delay caused by an enabled delay component in the first operating condition. The difference between the second number and the first number indicates the change of transmission delay from the normal voltage condition to the lowest voltage condition.

In light of the above, during the monitor mode, the delay contribution of the adjustable delay circuit 120, which is set in accordance with the first value of the calibration signal $S_{CAL}$, won't reach the predetermined delay in a normal operating condition (i.e., the second operating condition). When the current operating condition of the target circuit is getting worse and reaches the warning operating condition (i.e., the first operating condition), the delay contribution of the adjustable delay circuit 120 will reach the predetermined delay (while the degree of delay of the delay signal $w_2$ reaches the aforementioned predetermined threshold). If the current operating condition keeps getting worse (e.g., the aforementioned operating voltage keeps going down), the target circuit may not operate normally. Therefore, when the signal detector 130 finds that the degree of delay of the delay signal $w_2$ reaches/exceeds the predetermined threshold, the signal detector 130 can issue a warning signal according to the demand for implementation so that a circuit or user receiving the warning signal can lower the frequency of the aforementioned reference clock to ensure that the target circuit can operate normally in accordance with the lower frequency. It should be noted that during the calibration mode, the calibrating circuit 710 can output the calibration signal $S_{CAL}$ to the adjustable delay circuit 120 according to the detection result generated by the signal detector 130 every round in a specific operating condition and thereby use the increasing/decreasing values of the calibration signal $S_{CAL}$ to gradually increase/decrease the delay contribution of the adjustable delay circuit 120 until the detection result changes from the first/second result to the second/first result; consequently the setting of the adjustable delay circuit 120 corresponding to the change of the detection result stands for the relation between the specific operating condition and the value of the calibration signal $S_{CAL}$. When outputting the calibration signal $S_{CAL}$, the calibrating circuit 710 may output an enabling signal EN simultaneously to enable the signal generator 110 so that the signal generator 100 generates the predetermined signal $w_1$ for the next round of detection.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the present invention can rapidly detect and respond to the operating speed of the target circuit without considering and/or connecting any critical path of the target circuit. Accordingly, the present invention has the advantages of simplified design, quick response, and practicable applications.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A circuit operating speed detecting circuit, the circuit operating speed detecting circuit configured to detect an operating speed of a target circuit during a monitor mode, the target circuit operating according to a reference clock, the circuit operating speed detecting circuit comprising:

a signal generator configured to generate a predetermined signal in a current operating condition during the monitor mode, in which the current operating condition relates to at least one of a manufacturing process of the target circuit, a current operating voltage of the target circuit, a current temperature of the target circuit, and a current aging status of the target circuit;

an adjustable delay circuit coupled between the signal generator and a signal detector and configured to generate a delay signal according to the predetermined signal in the current operating condition during the monitor mode;

the signal detector configured to detect a degree of delay of the delay signal in the current operating condition during the monitor mode, and thereby generate a first result on condition that the degree of delay of the delay signal is equal to or less than a predetermined threshold and generate a second result on condition that the degree of delay of the delay signal is greater than the predetermined threshold, wherein each of the first result and the second result is related to the operating speed of the target circuit; and a calibrating circuit configured to execute a following step during a calibration mode:

outputting a calibration signal to the adjustable delay circuit according to one of the first result and the second result in a warning operating condition and thereby gradually adjusting the adjustable delay circuit with the calibration signal until a delay contribution of the adjustable delay circuit reaches a predetermined delay in the warning operating condition, wherein when the delay contribution of the adjustable delay circuit reaches the predetermined delay in the warning operating condition during the calibration mode, a value of the calibration signal is treated as a threshold value of the warning operating condition; the adjustable delay circuit is set according to the threshold value of the calibration signal in the monitor mode; and if the current operating condition reaches the warning operating condition during the monitor mode, the delay contribution of the adjustable delay circuit reaches the predetermined delay and the degree of delay of the delay signal reaches the predetermined threshold.

2. The circuit operating speed detecting circuit of claim 1, wherein the circuit operating speed detecting circuit is a digital circuit.

3. The circuit operating speed detecting circuit of claim 1, wherein both a transmission delay characteristic of the adjustable delay circuit and a transmission delay characteristic of the target circuit vary with the current operating condition, and a trend of the transmission delay characteristic of the adjustable delay circuit is proportional to a trend of the transmission delay characteristic of the target circuit.

4. The circuit operating speed detecting circuit of claim 1, wherein each of the first result and the second result is used for determining whether to adjust a frequency of the reference clock.

5. The circuit operating speed detecting circuit of claim 4, wherein when the target circuit operates in the current operating condition, the first result is used for maintaining or increasing the frequency of the reference clock, and the second result is used for decreasing the frequency of the reference clock.

6. The circuit operating speed detecting circuit of claim 4, wherein the predetermined threshold is related to a cycle of the reference clock.

7. The circuit operating speed detecting circuit of claim 6, wherein the predetermined threshold is equal to the cycle of the reference clock.

8. The circuit operating speed detecting circuit of claim 1, wherein the predetermined threshold is dependent upon a cycle of the reference clock.

9. The circuit operating speed detecting circuit of claim 8, wherein the predetermined threshold is equal to a cycle of the reference clock.

10. The circuit operating speed detecting circuit of claim 1, wherein the circuit operating speed detecting circuit is included in an integrated circuit including the target circuit.

11. The circuit operating speed detecting circuit of claim 1, wherein the adjustable delay circuit includes N delay units that are connected in series, and the adjustable delay circuit uses M delay unit(s) among the N delay units according to N control signals to generate the delay signal, in which the N is an integer greater than one and the M is a positive integer not greater than the N.

12. The circuit operating speed detecting circuit of claim 11, wherein each of the N delay units includes:
an input terminal configured to receive an input signal that is the predetermined signal or a delay version of the predetermined signal;
at least one delay component configured to generate an output signal by delaying the input signal; and
a multiplexer configured to output one of the input signal and the output signal according to the N control signals.

13. The circuit operating speed detecting circuit of claim 12, wherein the N delay units include a first delay unit and a second delay unit, and a maximum delay caused by the first delay unit is different from a maximum delay caused by the second delay unit in the current operating condition.

14. The circuit operating speed detecting circuit of claim 13, wherein a number of delay component(s) included in the first delay unit is different from a number of delay component(s) included in the second delay unit.

15. The circuit operating speed detecting circuit of claim 12, wherein the signal detector is used for sampling the predetermined signal and the delay signal and thereby generating two sample results, and further used for determining whether the degree of delay of the delay signal is greater than the predetermined threshold in accordance with a relation between the two sample results.

16. The circuit operating speed detecting circuit of claim 1, wherein the adjustable delay circuit includes N delay units and a multiplexer, the N delay units are connected in series, and the multiplexer is configured to receive an output signal of each of the N delay units and thereby output one of the N output signals of the N delay units according to a control signal.

17. The circuit operating speed detecting circuit of claim 16, wherein each of the N delay units includes:
an input terminal configured to receive an input signal that is the predetermined signal or a delay version of the predetermined signal;
at least one delay component configured to generate the output signal by delaying the input signal; and
an AND gate configured to generate a logical conjunction result of the input signal and the output signal.

18. The circuit operating speed detecting circuit of claim 16, wherein the signal detector is configured to detect a pulse width of the delay signal and thereby determine whether the degree of delay of the delay signal is greater than the predetermined threshold.

19. A circuit operating speed detecting circuit, the circuit operating speed detecting circuit configured to detect an operating speed of a target circuit during a monitor mode, the target circuit operating according to a reference clock, the circuit operating speed detecting circuit comprising:
a signal generator configured to generate a predetermined signal in a current operating condition during the monitor mode, in which the current operating condition relates to at least one of a manufacturing process of the target circuit, a current operating voltage of the target circuit, a current temperature of the target circuit, and a current aging status of the target circuit;
an adjustable delay circuit coupled between the signal generator and a signal detector and configured to generate a delay signal according to the predetermined signal in the current operating condition during the monitor mode; and
the signal detector including a counter configured to measure a pulse width of the delay signal so that the signal detector detects a degree of delay of the delay signal according to the pulse width in the current operating condition during the monitor mode, then generates a first result on condition that the degree of delay of the delay signal is equal to or less than a predetermined threshold, and generates a second result on condition that the degree of delay of the delay signal is greater than the predetermined threshold,
wherein each of the first result and the second result is related to the operating speed of the target circuit.

20. The circuit operating speed detecting circuit of claim 19, wherein the adjustable delay circuit includes N delay units and a multiplexer, the N delay units are connected in series, and the multiplexer is configured to receive an output signal of each of the N delay units and thereby output one of the N output signals of the N delay units according to a control signal.

* * * * *